(12) United States Patent
Park et al.

(10) Patent No.: US 12,365,172 B2
(45) Date of Patent: Jul. 22, 2025

(54) WINDOW MANUFACTURING METHOD

(71) Applicant: Samsung Display Co., Ltd., Yongin-Si (KR)

(72) Inventors: Sunkyun Park, Asan-si (KR); Sung-Shin Kwak, Cheongju-si (KR); Sunkwan Kim, Cheonan-si (KR); Seungjun Lee, Cheonan-si (KR); Jun Hwan Choi, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 888 days.

(21) Appl. No.: 17/476,835

(22) Filed: Sep. 16, 2021

(65) Prior Publication Data

US 2022/0234305 A1 Jul. 28, 2022

(30) Foreign Application Priority Data

Jan. 25, 2021 (KR) .................. 10-2021-0010162

(51) Int. Cl.
| | |
|---|---|
| B32B 37/00 | (2006.01) |
| B29C 65/00 | (2006.01) |
| B29C 65/48 | (2006.01) |
| B29C 65/56 | (2006.01) |
| B29C 65/78 | (2006.01) |
| B29D 7/01 | (2006.01) |
| B29L 7/00 | (2006.01) |
| B29L 31/00 | (2006.01) |

(Continued)

(52) U.S. Cl.
CPC .......... *B32B 37/0053* (2013.01); *B29C 65/48* (2013.01); *B29C 65/567* (2013.01); *B29C 65/7847* (2013.01); *B29C 65/7894* (2013.01); *B29C 66/00441* (2013.01); *B29C 66/006* (2013.01); *B29C 66/45* (2013.01); *B29D 7/01* (2013.01); *B65H 20/02* (2013.01); *B65H 20/30* (2013.01); *H10K 59/871* (2023.02); *B29L 2007/002* (2013.01); *B29L 2031/3475* (2013.01); *B29L 2031/778* (2013.01); *B65H 2801/61* (2013.01); *H10K 59/131* (2023.02); *H10K 59/8792* (2023.02)

(58) Field of Classification Search
None
See application file for complete search history.

(56) References Cited

U.S. PATENT DOCUMENTS

| | | | |
|---|---|---|---|
| 8,827,260 B2 | 9/2014 | Kim et al. | |
| 8,865,505 B2 * | 10/2014 | Nakahama | H01L 31/0481 |
| | | | 438/66 |
| 2016/0009025 A1 | 1/2016 | Lee et al. | |

FOREIGN PATENT DOCUMENTS

| | | |
|---|---|---|
| KR | 100669419 B1 | 1/2007 |
| KR | 101360008 B1 | 2/2014 |

(Continued)

*Primary Examiner* — Barbara J Musser
(74) *Attorney, Agent, or Firm* — CANTOR COLBURN LLP

(57) ABSTRACT

A window manufacturing method includes providing a first adhesive on a dummy substrate, providing a first mother substrate on the first adhesive, disposing a first portion of an interleaving paper on a surface of a suction stage disposed on the first mother substrate, the surface of the suction stage facing the first mother substrate, and pressing the suction stage toward the first mother substrate to attach the first mother substrate to the dummy substrate.

12 Claims, 10 Drawing Sheets

(51) Int. Cl.
*B29L 31/34* (2006.01)
*B65H 20/02* (2006.01)
*B65H 20/30* (2006.01)
*H10K 59/131* (2023.01)
*H10K 59/80* (2023.01)

(56) References Cited

FOREIGN PATENT DOCUMENTS

| | | |
|---|---|---|
| KR | 101459065 B1 | 11/2014 |
| KR | 101547899 B1 | 8/2015 |
| KR | 1020160006334 A | 1/2016 |
| KR | 101849351 B1 | 4/2018 |

* cited by examiner

WINDOW MANUFACTURING METHOD

This application claims priority to Korean Patent Application No. 10-2021-0010162, filed on Jan. 25, 2021, and all the benefits accruing therefrom under 35 U.S.C. § 119, the content of which in its entirety is herein incorporated by reference.

BACKGROUND

1. Field

Embodiments of the invention herein relate to a window manufacturing apparatus, and a window manufacturing method using the same.

2. Description of the Related Art

In general, to display an image, a display device includes a display panel including a plurality of pixels, and a window that protects the display panel and is disposed on the display panel. The window may include glass or a transparent plastic material.

The window protects a display panel from an external scratch and impact. The window is attached to the display panel using an adhesive. Images generated from the display panel are provided to a user through the window.

SUMMARY

Embodiments of the invention provide a window manufacturing apparatus capable of simplifying a window manufacturing process, and a window manufacturing method using the same.

An embodiment of the invention provides a window manufacturing method including providing a first adhesive on a dummy substrate, providing a first mother substrate on the first adhesive, disposing a first portion of an interleaving paper on a surface of a suction stage disposed on the first mother substrate, the surface of the suction stage facing the first mother substrate, and pressing the suction stage toward the first mother substrate to attach the first mother substrate to the dummy substrate.

In an embodiment of the invention, a window manufacturing apparatus includes a stage, a suction stage disposed on the stage, a pressing roller disposed on the suction stage, an interleaving paper disposed between the stage and the suction stage, and a plurality of rollers to which opposite ends of the interleaving paper are connected, and around which the interleaving paper is rolled, where a portion of the interleaving paper disposed under the suction stage is changeable through the rotation of the plurality of rollers.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
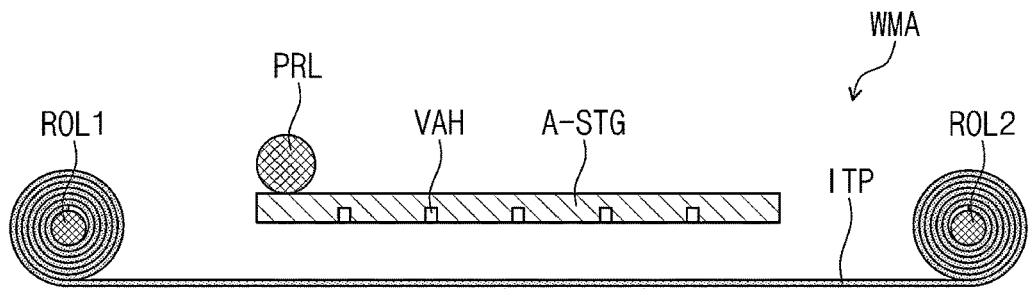
FIG. 1 is a diagram illustrating an embodiment of the configuration of a window manufacturing apparatus according to the invention.
Figure 1:

In this specification, It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

Like numbers refer to like elements throughout. The thickness and the ratio and the dimension of the element are exaggerated for effective description of the technical contents.

As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

The terminology used herein is for the purpose of describing particular embodiments only and is not intended to be limiting of the invention. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the drawing figures. It will be understood that the spatially relative terms are intended to encompass different orientations of the device in use or operation in addition to the orientation depicted in the drawing figures. For example, if the device in the drawing figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be explained in detail with reference to the accompanying drawings.

FIG. 1 is a diagram illustrating an embodiment of the configuration of a window manufacturing apparatus according to the invention.

Referring to FIG. 1, a window manufacturing apparatus WMA in an embodiment of the invention may include a stage STG, a suction stage A-STG, a pressing roller PRL, a plurality of rollers ROL1 and ROL2, and an interleaving paper ITP.

The stage STG may have a plane defined by a first direction DR1 and a second direction DR2 crossing the first direction DR1. An object to be processed may be disposed on the stage STG.

Hereinafter, a direction which crosses substantially perpendicular to a plane defined by the first direction DR1 and the second direction DR2 is defined as a third direction DR3. In addition, in the specification, the meaning of a plan view is defined as a view in the third direction DR3.

The suction stage A-STG may be disposed on the stage STG. The suction stage A-STG may have a plane defined by the first direction DR1 and the second direction DR2. The suction stage A-STG may include aluminum. In an embodiment, the suction stage A-STG may include anodized aluminum, for example.

A plurality of vacuum suction holes VAH may be defined in the lower surface of the suction stage A-STG. In an embodiment, as the vacuum suction holes VAH may discharge air to the outside to maintain a vacuum state thereof, a predetermined suctioning force may be generated in the vacuum suction holes VAH, for example.

The pressing roller PRL may be disposed on the suction stage A-STG. The pressing roller PRL may press the suction stage A-STG while move in a direction (e.g., the second direction DR2). The pressing roller PRL may have a cylindrical shape extending in the first direction DR1. The pressing roller PRL may move in the second direction DR2 while rotating about a rotation axis parallel to the first direction DR1.

The interleaving paper ITP may be disposed between the stage STG and the suction stage A-STG. The interleaving paper ITP may include paper. The interleaving paper ITP may be disposed under the suction stage A-STG, and may extend outward from the suction stage A-STG in the second direction DR2.

The rollers ROL1 and ROL2 may be spaced apart from the suction stage A-STG in a direction (e.g., the second direction DR2) parallel to the plane of the suction stage A-STG, for example. The suction stage A-STG may be disposed between the rollers ROL1 and ROL2. Opposite ends of the interleaving paper ITP are respectively connected to the rollers ROL1 and ROL2, and the interleaving paper ITP may be rolled around the rollers ROL1 and ROL2. The rollers ROL1 and ROL2 may each have a cylindrical shape extending in the first direction DR1.

The rollers ROL1 and ROL2 may include a first roller ROL1 spaced apart from one side of the suction stage A-STG in the second direction DR2, and a second roller ROL2 spaced apart from the other side of the suction stage A-STG in the second direction DR2. The one side of the suction stage A-STG and the other side of the suction stage A-STG may be opposite sides of the suction stage A-STG which are opposed to each other in the second direction DR2. The suction stage A-STG may be disposed between the first roller ROL1 and the second roller ROL2.

One end of the interleaving paper ITP may be connected to the first roller ROL1, and the other end of the interleaving paper ITP may be connected to the second roller ROL2. The interleaving paper ITP may be rolled around the first roller ROL1 and the second roller ROL2, or may be unrolled from the first roller ROL1 and the second roller ROL2.

The first roller ROL1 and the second roller ROL2 may rotate in the same direction to allow the interleaving paper ITP to be rolled and unrolled. In an embodiment, the first roller ROL1 and the second roller ROL2 may rotate counterclockwise, for example, but the invention is not limited thereto. Thus, the first roller ROL1 and the second roller ROL2 may rotate clockwise. The first roller ROL1 and the second roller ROL2 may respectively rotate about rotation axes parallel to the first direction DR1.

A portion of the interleaving paper ITP disposed under the suction stage A-STG may be changed through rotation of the first roller ROL1 and the second roller ROL2. The portion of the interleaving paper ITP disposed under the suction stage A-STG may be suctioned to the suction stage A-STG by the suctioning force generated in the vacuum suction holes VAH.

FIGS. 2 to 9 are diagrams for illustrating an embodiment of a window manufacturing method according to the invention.

Figure 2:
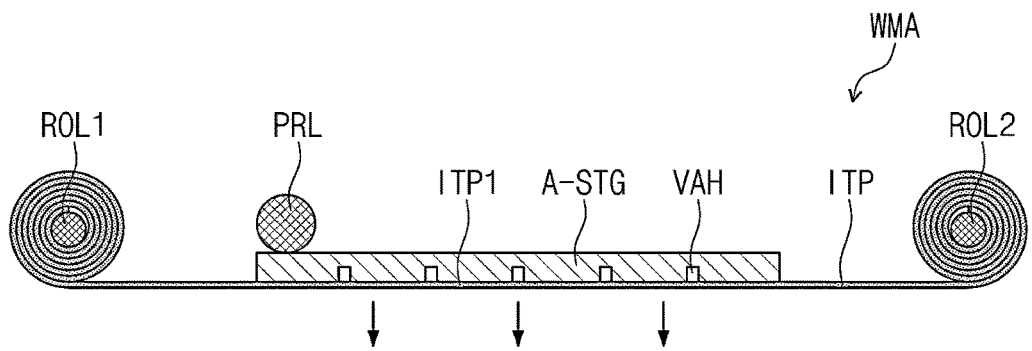
FIGS. 2 to 9 are diagrams for illustrating an embodiment of a window manufacturing method according to the invention.
Figure 2:
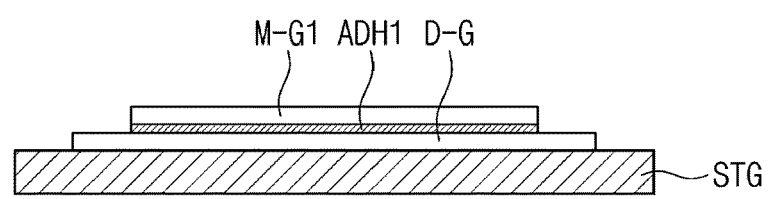
Figure 2:
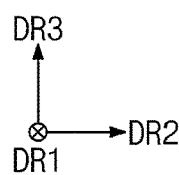

Referring to FIG. 2, a dummy substrate D-G may be disposed on the stage STG. The dummy substrate D-G may include glass. The dummy substrate D-G may be suctioned onto the upper surface of the stage STG, and may be fixed on the stage STG. Although not shown, vacuum suction holes VAH for generating a suctioning force may be defined in the upper surface of the stage STG.

A first adhesive ADH1 may be provided on the dummy substrate D-G. The first adhesive ADH1 may include a pressure sensitive adhesive ("PSA"), or an optically clear adhesive ("OCA").

A first mother substrate M-G1 may be provided on the first adhesive ADH1. The first mother substrate M-G1 may include glass. The glass of the first mother substrate M-G1 may be defined as an ultrathin glass. In an embodiment, the first mother substrate M-G1 may have a thickness of about 30 micrometers (μm) along the third direction DR3. The area of the first mother substrate M-G1 may be smaller than that of the dummy substrate D-G, when viewed from the top.

The suction stage A-STG may be disposed on the first mother substrate M-G1. A first portion ITP1 of the interleaving paper ITP may be disposed between the suction stage A-STG and the first mother substrate M-G1. The first portion ITP1 may be disposed on the lower surface of the suction stage A-STG. The first portion ITP1 may be defined a portion of the interleaving paper ITP overlapping the suction stage A-STG, when viewed from the top.

The lower surface of the suction stage A-STG may face the first mother substrate M-G1. The first portion ITP1 may be suctioned to the suction stage A-STG by the suctioning force generated in the vacuum suction holes VAH. The first portion ITP1 may be suctioned to the lower surface of the suction stage A-STG, and the suction stage A-STG and the first portion ITP1 may move down.

Figure 3:
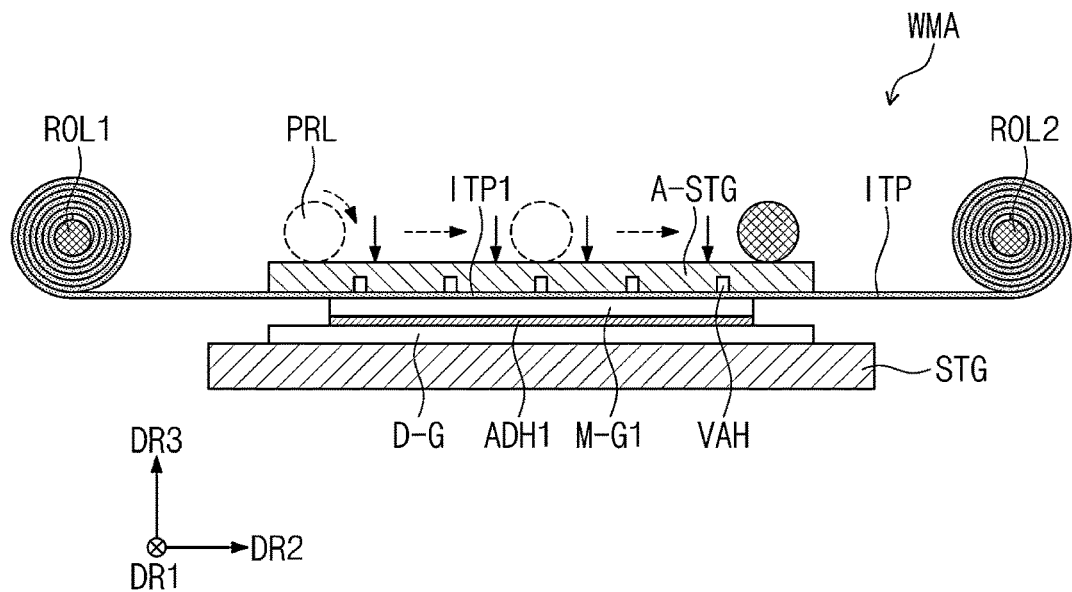

Referring to FIG. 3, as the suction stage A-STG moves down, the first portion ITP1 of the interleaving paper ITP may be disposed between the suction stage A-STG and the first mother substrate M-G1. The first portion ITP1 may contact the upper surface of the first mother substrate M-G1.

The suction stage A-STG may not directly contact the first mother substrate M-G1 due to the interleaving paper ITP. When the suction stage A-STG directly contacts the first mother substrate M-G1, the first mother substrate M-G1 may be damaged by the suction stage A-STG. In an embodiment, a scratch may occur on the upper surface of the first mother substrate M-G1 due to the suction stage A-STG, for example.

In an embodiment of the invention, since the interleaving paper ITP may be disposed between the suction stage A-STG and the first mother substrate M-G1, the interleaving paper ITP may protect the first mother substrate M-G1 from the suction stage A-STG.

As the suction stage A-STG is pressed toward the first mother substrate M-G1, the first mother substrate M-G1 may be attached to the dummy substrate D-G. The first mother substrate M-G1 and the dummy substrate D-G may be attached to each other by the first adhesive ADH1.

A pressing roller PRL may be used for pressing the suction stage A-STG toward the first mother substrate M-G1. The pressing roller PRL may move, while rotating, on the upper surface of the suction stage A-STG in the second direction DR2, thereby pressing the suction stage A-STG toward the first mother substrate M-G1.

The pressing roller PRL may move from the upper surface of the suction stage A-STG adjacent to one side (e.g., left side in FIG. 3) of the suction stage A-STG to the upper surface of the suction stage A-STG adjacent to the other side (e.g., right side in FIG. 3) of the suction stage A-STG. The pressing roller PRL may press the suction stage A-STG toward the first mother substrate M-G1, so that the first mother substrate M-G1 may be attached to the dummy substrate D-G.

When the pressing roller PRL directly press the first mother substrate M-G1 to attach the first mother substrate M-G1 to the dummy substrate D-G, the first mother substrate M-G1 may be damaged by the pressing roller PRL.

However, in an embodiment of the invention, the pressure of the pressing roller PRL may be delivered to the first mother substrate M-G1 through the suction stage A-STG. Accordingly, since the pressing roller PRL does not directly contact the first mother substrate M-G1, the first mother substrate M-G1 may be prevented from being damaged.

Figure 4:
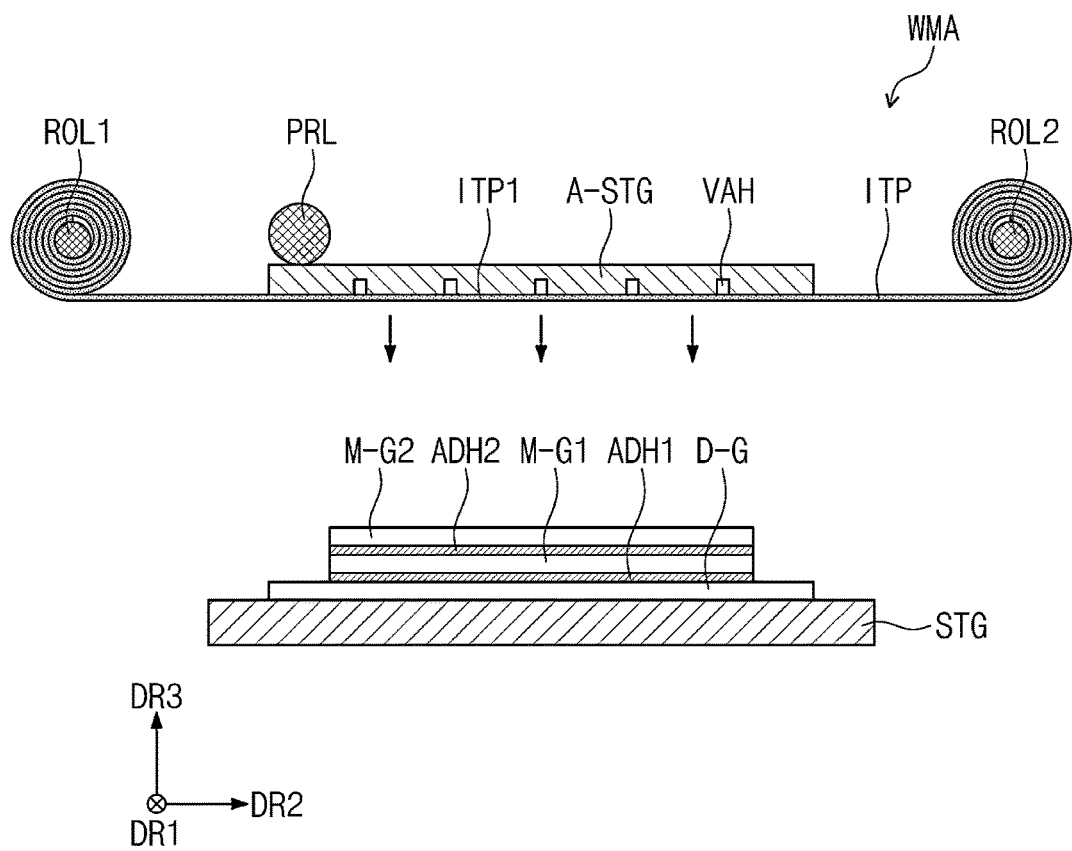

Referring to FIG. 4, after the first mother substrate M-G1 is attached to the dummy substrate D-G by the first adhesive ADH1, the suction stage A-STG and the interleaving paper ITP may be spaced above from the first mother substrate M-G1.

A second adhesive ADH2 may be provided on the first mother substrate M-G1, and the second mother substrate M-G2 may be provided on the second adhesive ADH2. The second mother substrate M-G2 may include the same material as that of the first mother substrate M-G1, and the second adhesive ADH2 may include the same material as that of the first adhesive ADH1. In an embodiment, the second mother substrate M-G2 may include glass, and the second adhesive ADH2 may include a PSA or an OCA, for example.

Figure 5:
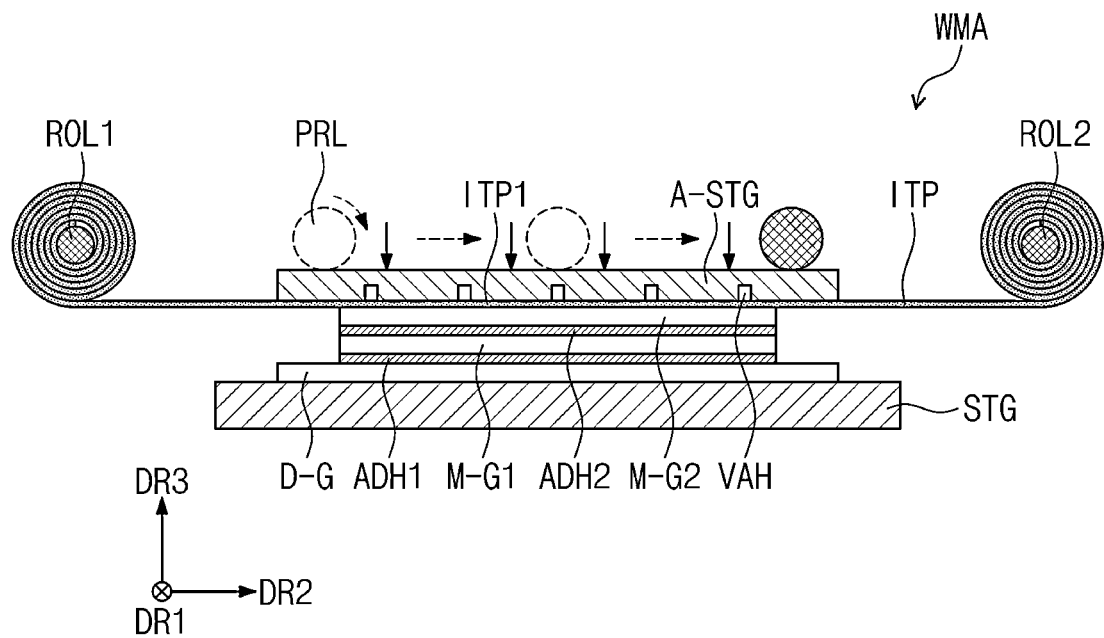

Referring to FIG. 5, the suction stage A-STG may move down, so that the first portion ITP1 may contact the upper surface of the second mother substrate M-G2. The suction stage A-STG may not directly contact the second mother substrate M-G2 due to the interleaving paper ITP.

The suction stage A-STG may press toward the second mother substrate M-G2, so that the second mother substrate M-G2 may be attached to the first mother substrate M-G1. The second mother substrate M-G2 and the first mother substrate M-G1 may be attached to each other by the second adhesive ADH2.

The pressing roller PRL may move, while rotating, on the upper surface of the suction stage A-STG in the second direction, thereby pressing the suction stage A-STG toward the second mother substrate M-G2. The pressing roller PRL may press the suction stage A-STG toward the second mother substrate M-G2, so that the second mother substrate M-G2 may be attached to the first mother substrate M-G1.

Figure 6:
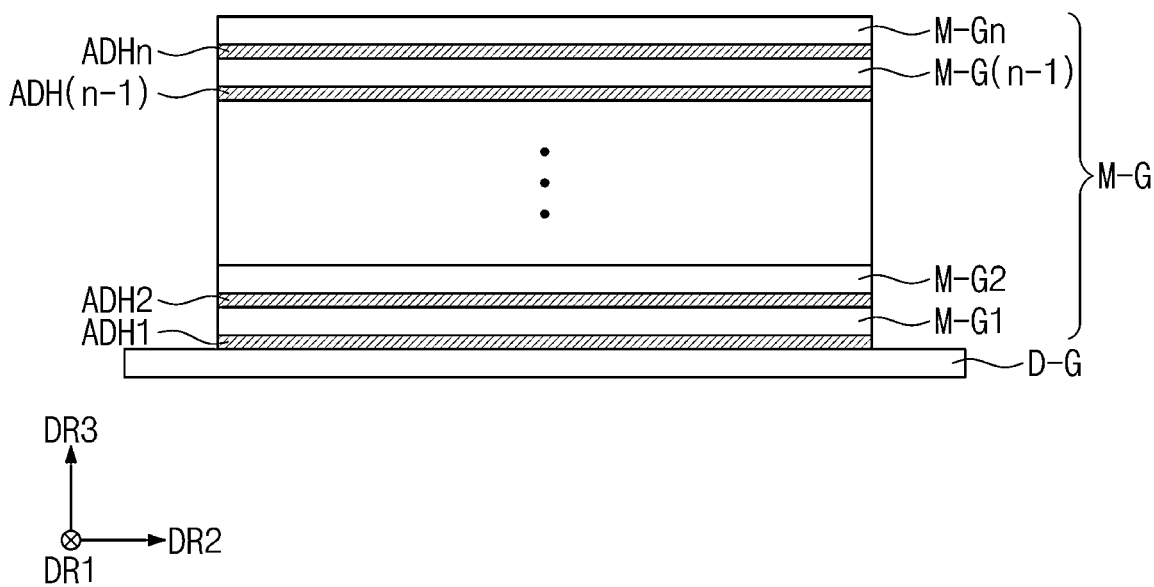

Referring to FIG. 6, the aforementioned operations illustrated in FIGS. 2 to 5 may be repeated n times, and first to n-th mother substrates M-G1 to M-Gn may be stacked. In an embodiment, an n-th adhesive ADHn may be provided on an (n−1)-th mother substrate M-G(n−1), an n-th mother substrate M-Gn may be provided on the n-th adhesive ADHn, and the suction stage A-STG may be pressed toward the n-th mother substrate M-Gn to attach the n-th mother substrate M-Gn to the (n−1)-th mother substrate M-G(n−1), for example. Here, n is a natural number of 2 or more.

Accordingly, the first mother substrate M-G1 to the n-th mother substrate M-Gn may be sequentially stacked. The dummy substrate D-G and the first to n-th mother substrates M-G1 to M-Gn may be attached to each other by the first adhesive ADH1 to n-th adhesive ADHn which are sequentially provided. In an embodiment, n may be 15, for example. That is, fifteen mother substrates may be stacked.

The (n−1)-th mother substrate M-G(n−1) and the n-th mother substrate M-Gn may include glass, and the (n−1)-th adhesive ADH(n−1) and the n-th adhesive ADHn may include a PSA and an OCA.

Hereinafter, a configuration including the first to n-th mother substrates M-G1 to M-Gn is defined as a mother substrate M-G. After the mother substrate M-G including the first to n-th mother substrates M-G1 to M-Gn is formed or provided, the dummy substrate D-G and the mother substrate M-G may be separated from the stage STG and move to a processing chamber for cutting.

Such an operation may be repeated. That is, after the mother substrate M-G moves to the processing chamber for cutting, new first to n-th mother substrates may stacked again by a window manufacturing apparatus WMA.

Figure 7:
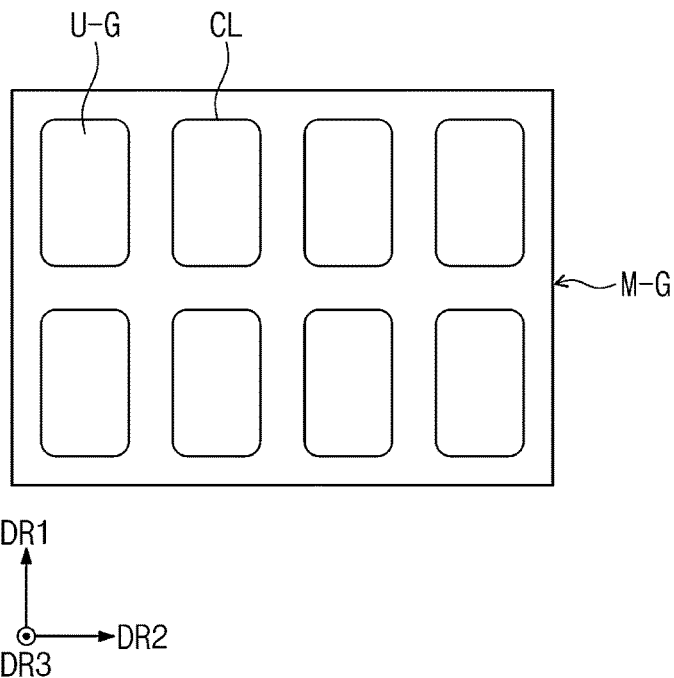

Referring to FIG. 7, when viewed from the top, the mother substrate M-G may have a quadrangular (e.g., rectangular) shape including short sides extending in the first direction DR1, and long sides extending in the second direction DR2. However, the shape is described, and the mother substrate M-G may have various shapes.

A plurality of cutting lines CL may be defined in the mother substrate M-G. Each of the cutting lines CL may form a single closed curve. A unit substrate U-G may be defined by each of the cutting lines CL. Each of the unit substrate U-G may include long sides extending in the first direction DR1 and short sides extending in the second direction DR2.

Figure 8:
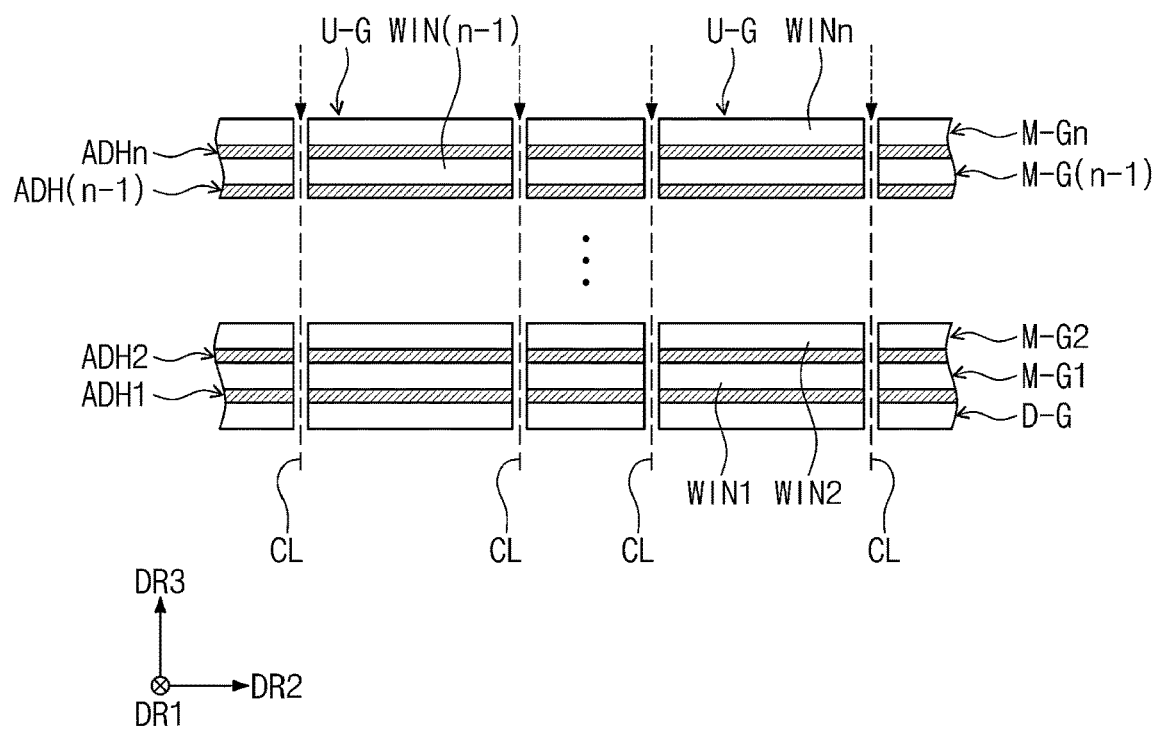

FIG. 8 is a diagram for illustrating cutting along two arbitrary cutting lines illustrated in FIG. 7.

Referring to FIGS. 7 and 8, a mother substrate M-G may be cut along cutting lines CL, and a plurality of unit substrates U-G may be formed or provided. That is, the mother substrate M-G may be cut into a plurality of unit substrates U-G.

The cutting lines CL may be cut in various ways. In an embodiment, the cutting lines CL may be cut by an intense light (a laser beam) or a blade (e.g., a knife), for example.

Each of unit substrates U-G may include first to n-th windows WIN1 to WINn stacked and attached to each other. Substantially, first to n-th mother substrates M-G1 to M-Gn may be cut, and the first to n-th windows WIN1 to WINn may be formed or provided.

The first to n-th windows WIN1 to WINn may be attached to each other by second to n-th adhesives ADH2 to ADHn. A first window WIN1 may be attached to a dummy substrate D-G by the first adhesive ADH1.

Figure 9:
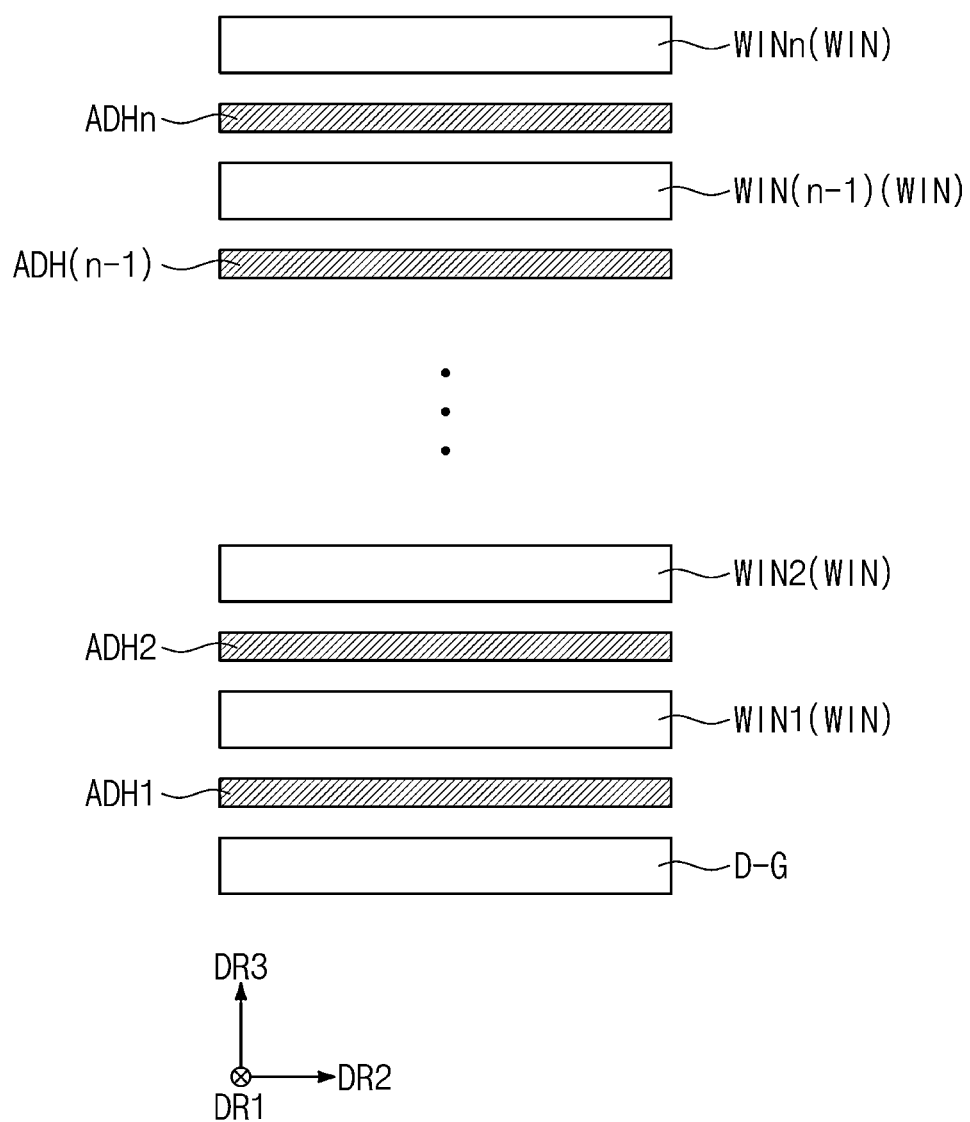

Referring to FIG. 9, the first to n-th windows WIN1 to WINn may be separated from the dummy substrate D-G, and the first to n-th windows WIN1 to WINn may be separated from each other. Each of the first to n-th windows WIN1 to WINn separated from each other may be defined as a window WIN. The window WIN may be used as a window for protecting a display panel during manufacture of a display device.

Windows Win may be manufactured by cutting a single mother substrate M-G (any one of first to n-th mother substrates M-G1 to M-Gn). However, when a thin single mother substrate M-G is cut, the edges of the windows may not be cut precisely and may be damaged.

However, in an embodiment of the invention, a window WIN may be produced by stacking a plurality of first to n-th mother substrates M-G1 to M-Gn, and then cutting a thicker mother substrate M-G, so that the edges of the windows WIN may be cut more precisely.

Processing first to n-th mother substrates M-G1 to M-Gn including glass is described, but the invention is not limited thereto, and the first to n-th mother substrates M-G1 to M-Gn may include a plastic material.

Figure 10:
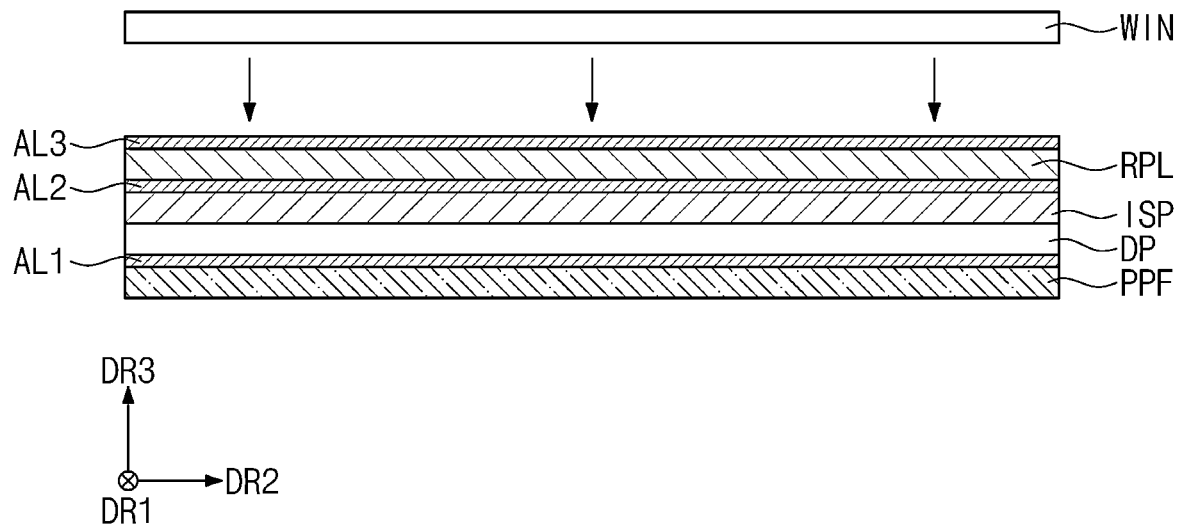
FIGS. 10 and 11 are diagrams illustrating a display device which is manufactured using any one window illustrated in FIG. 9.
Figure 11:
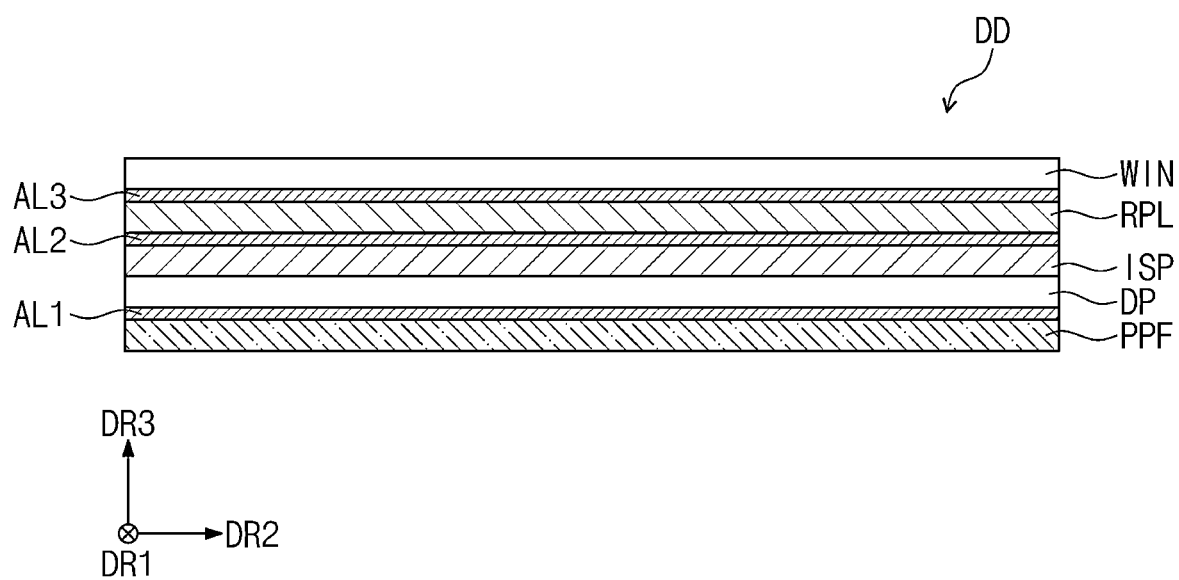

FIGS. 10 and 11 are diagrams illustrating a display device manufactured by any one window illustrated in FIG. 9.

Referring to FIGS. 10 and 11, a window WIN may be disposed on a display panel DP. Specifically, an input-sensing portion ISP may be disposed on the display panel DP, an anti-reflection layer RPL may be disposed on the input-sensing portion ISP, and the window WIN may be disposed on the anti-reflection layer RPL. A panel protective film PPF may be disposed under the display panel DP.

The display panel DP may be a flexible display panel. The display panel DP in an embodiment of the invention may be a light-emitting display panel, and is not specially limited. In an embodiment, the display panel DP may be an organic light-emitting display panel, or a quantum dot light-emitting display panel. A light-emitting layer of the organic light-emitting display panel may include an organic light-emitting material. A light-emitting layer of the quantum dot light-emitting display panel may include a quantum dot and a quantum rod, etc.

The input-sensing portion ISP may include a plurality of sensors (not shown) for capacitively sensing an external input. The input-sensing portion ISP may be manufactured directly on the display panel DP during manufacture of the display device DD, but the invention is not limited thereto. The input-sensing portion ISP may be manufactured as a separate panel from the display panel DP, and may be attached to the display panel DP by an adhesive layer.

The anti-reflection layer RPL may be defined as an anti-reflection film for protecting external light. The anti-reflection layer RPL may reduce the reflectivity of external light incident from the display device DD onto the display panel DP.

When external light propagating toward the display panel DP is reflected by the display panel DP and provided to an external user again, the user may visually recognize the external light. To prevent such a phenomenon, the anti-reflection layer RPL may include, for example, a plurality of color filters that display the same color as pixels of the display panel DP.

Color filters may filter external light to the same colors as those of pixels. In this case, the external light may not be visually recognized by a user. However, an embodiment of the invention is not limited thereto, and the anti-reflection layer RPL may include a phase retarder and/or a polarizer to reduce the reflectivity of the external light.

The panel protective film PPF may protect a lower portion of the display panel DP. In an embodiment, the panel protective film PPF may include a flexible plastic material such as polyethyleneterephthalate ("PET").

A first adhesive layer AL1 may be disposed between the display panel DP and the panel protective film PPF. The display panel DP and the panel protective film PPF may be attached to each other by the first adhesive layer AL1.

A second adhesive layer AL2 may be disposed between the anti-reflection layer RPL and the input-sensing portion ISP. The anti-reflection layer RPL and the input-sensing portion ISP may be attached to each other by the second adhesive layer AL2.

A third adhesive layer AL3 may be disposed between the window WIN and the anti-reflection layer RPL. The window WIN and the anti-reflection layer RPL may be attached to each other by the third adhesive layer AL3. The window WIN may be attached to the anti-reflection layer RPL and the display device DD may be manufactured. When the anti-reflection layer RPL and the input-sensing portion ISP are not used, the window WIN may be attached to the display panel DP by an adhesive layer.

The window WIN may protect the display panel DP, the input-sensing portion ISP, and the anti-reflection layer RPL from external scratch and impact.

Figure 12:
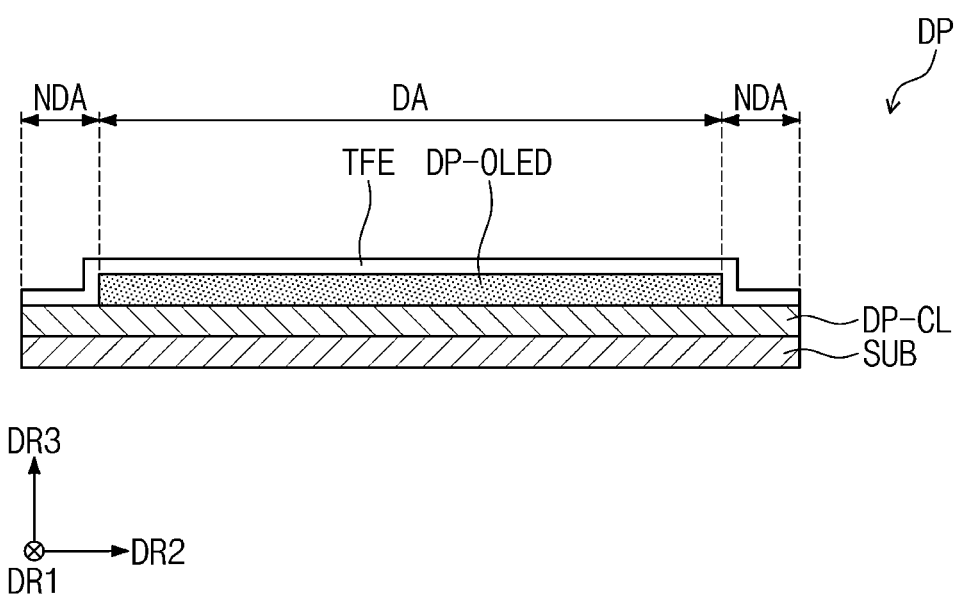
FIG. 12 is a diagram illustrating a cross-section of a display panel illustrated in FIG. 11.

FIG. 12 is a diagram illustrating a cross-section of a display panel illustrated in FIG. 11.

Referring to FIG. 12, a display panel DP may include a substrate SUB, a circuit element layer DP-CL disposed on the substrate SUB, a display element layer DP-OLED disposed on the circuit element layer DP-CL, and a thin-film encapsulation layer TFE disposed on the display element layer DP-OLED.

The substrate SUB may include a display region DA and a non-display region NDA around the display region DA. In an embodiment, the substrate SUB may include a flexible plastic material such as polyimide ("PI"). The display element layer DP-OLED may be disposed on the display region DA.

A plurality of pixels may be disposed on the circuit element layer DP-CL and the display element layer DP-OLED. Pixels may each include a transistor disposed on the circuit element layer DP-CL, and a light-emitting element disposed on the display element layer DP-OLED and connected to the transistor.

The thin-film encapsulation layer TFE may be disposed on the circuit element layer DP-CL so as to cover the display element layer DP-OLED. The thin-film encapsulation layer TFE may include inorganic layers and an organic layer between the inorganic layers. The inorganic layers may protect pixels from moisture/oxygen. The organic layer may protect pixels PX from a foreign material such as a dust particle.

Figure 13:
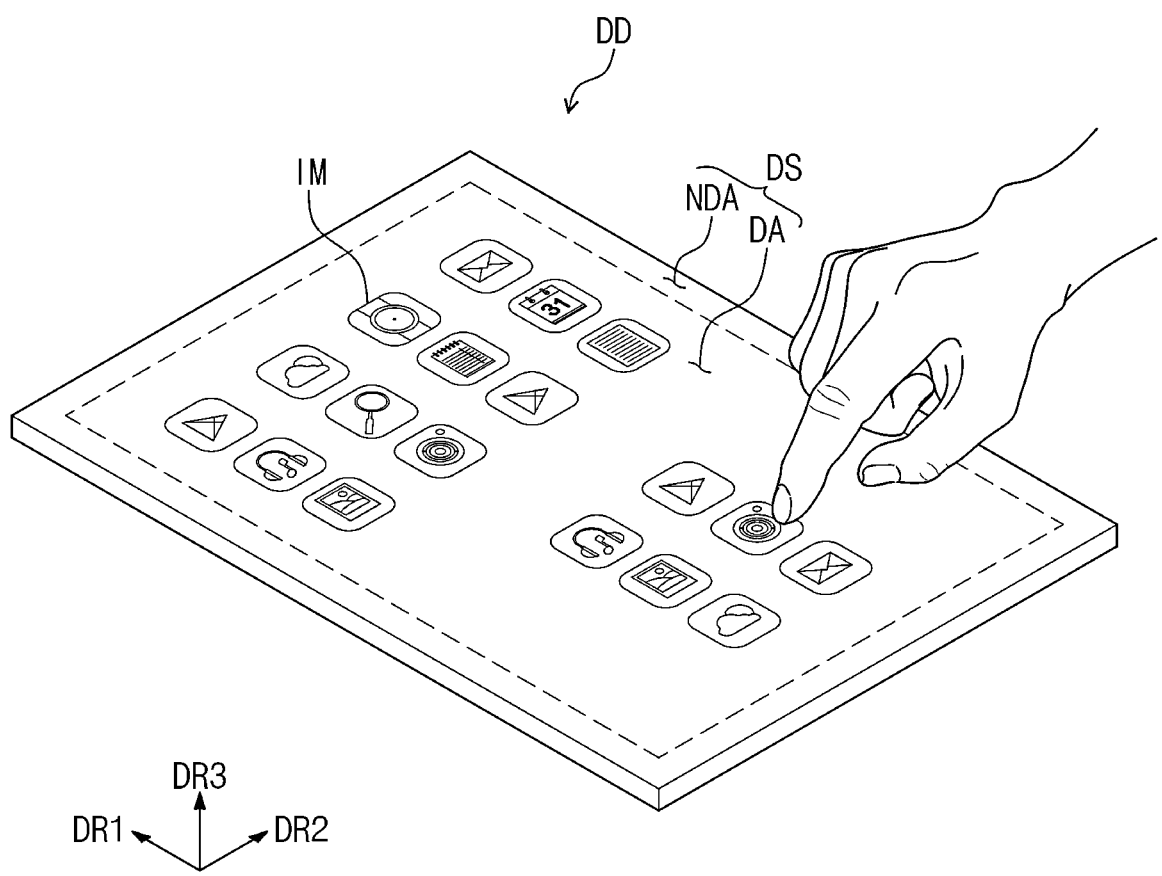
FIG. 13 is a perspective view of the display device illustrated in FIG. 11.

FIG. 13 is a perspective view of the display device illustrated in FIG. 11.

Referring to FIG. 13, a display device DD may have a quadrangular (e.g., rectangular) shape including long sides extending in the first direction DR1 and short sides extending in the second direction DR2. However, an embodiment of the invention is not limited thereto, and the display device DD may have various shapes such as a circular shape, or a polygonal shape.

The upper surface of the display device DD may be defined as a display surface DS, and may have a plane defined by the first direction DR1 and the second direction DR2. Images IM generated by the display device DD may be provided to a user through the display surface DS.

The display surface DS may include a display region DA and a non-display region NDA around the display region DA. The display region DA may display images, and the non-display region NDA may not display images. The non-display region NDA may surround the display region DA, and may define the edge of the display device DD printed with a predetermined color.

In an embodiment, the display device DD may be used in large electronic devices such as a television, a monitor, or an external advertisement board. In another embodiment, the display device DD may be used in small- and medium-sized electronic devices such as a personal computer, a notebook computer, a personal digital terminal, a car navigation system, a game console, a smart phone, a tablet, or a camera. However, these are presented only as embodiments, and the display device may be used in other electronic devices without departing from the inventive concept.

Figure 14:
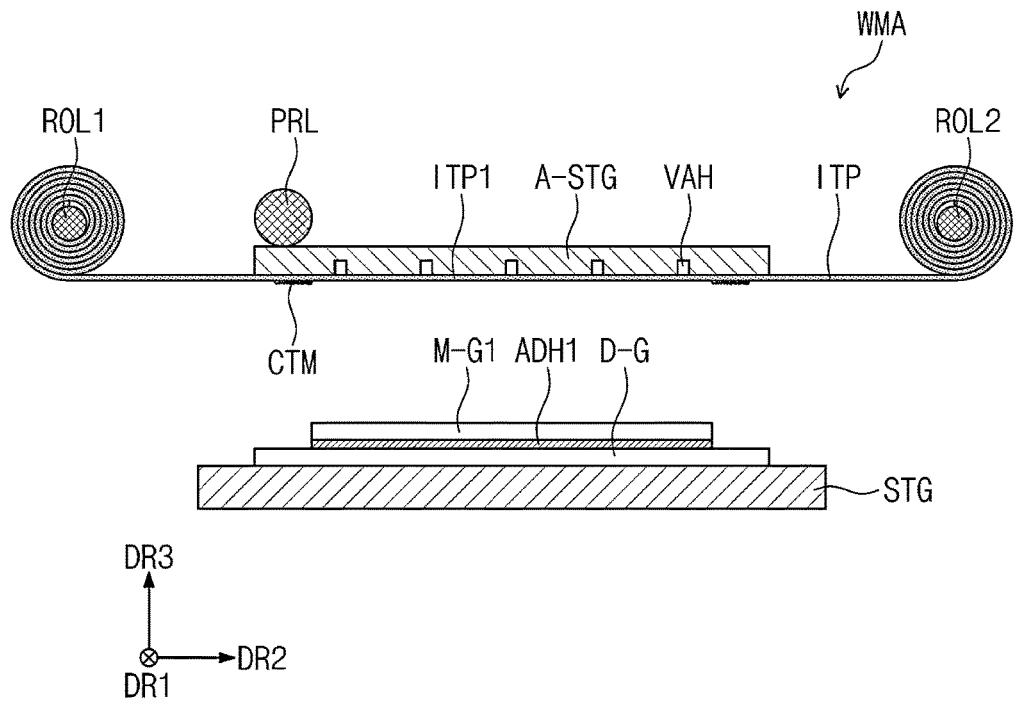
FIGS. 14 to 16 are diagrams for illustrating an operation for replacing a first portion of interleaving paper illustrated in FIGS. 2 to 9.
Figure 15:
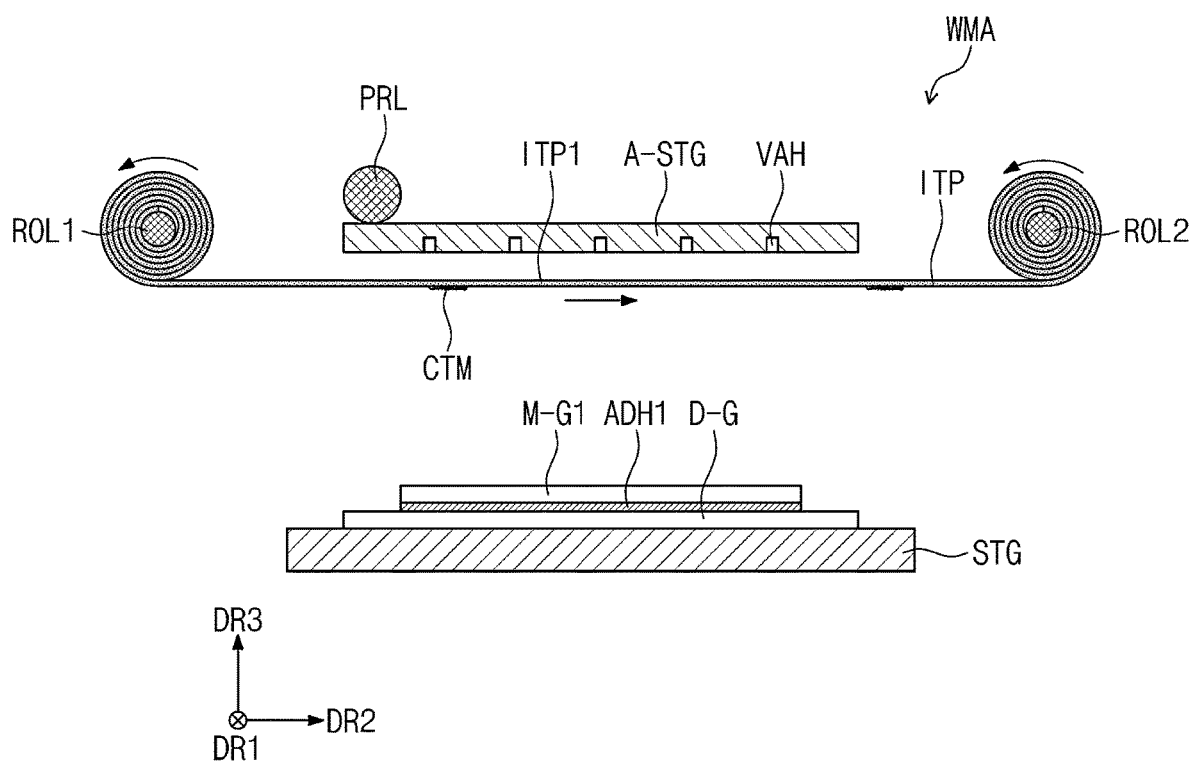
Figure 16:
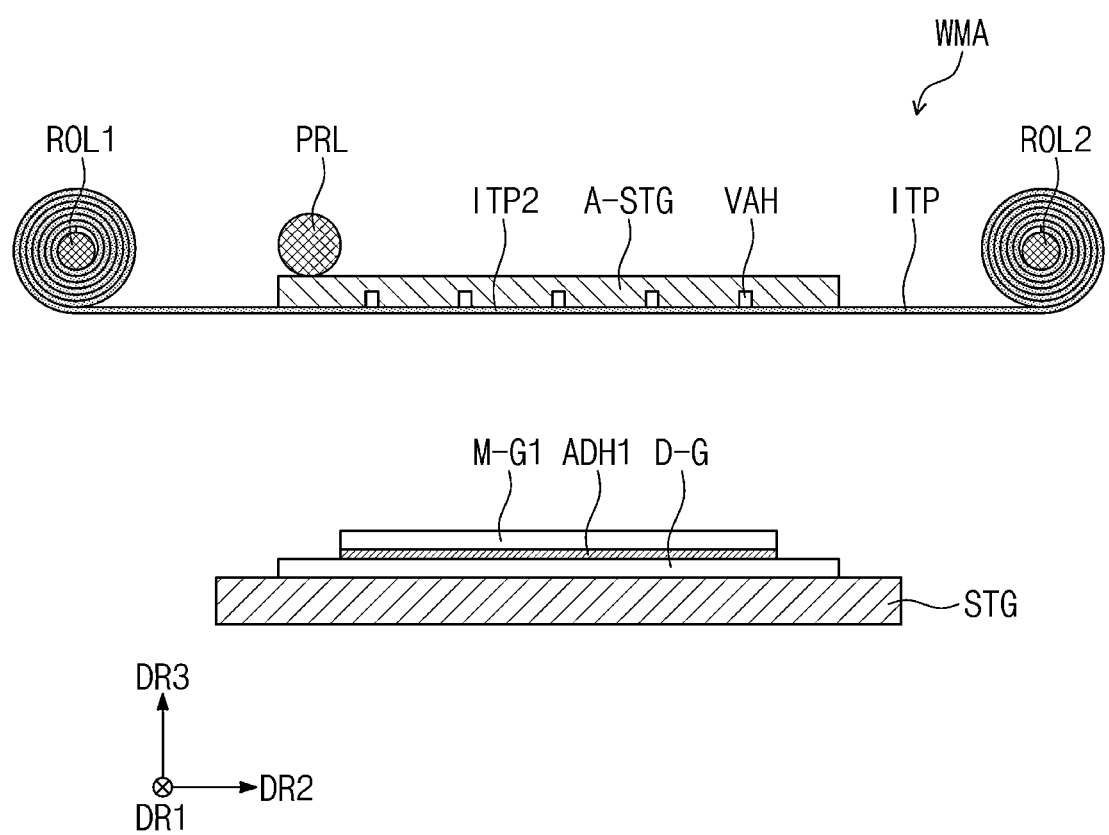

FIGS. 14 to 16 are diagrams for describing an operation of replacing the first portion of the interleaving paper illustrated in FIGS. 2 to 9.

Referring to FIG. 14, when the first portion ITP1 of the interleaving paper ITP is continuously used, a contamination material CTM may adhere to the first portion ITP1. In an embodiment, in a pressing operation as illustrated in FIGS. 2 and 4, the first adhesive ADH1 and the second adhesive ADH2 which are pressed may be discharged to the outside of the first mother substrate M-G1 and the second mother substrate M-G2, for example. The adhesive material discharged to the outside of the first mother substrate M-G1 and the second mother substrate M-G2 may adhere to the first portion ITP1 as a contamination material CTM.

When the contamination material CTM continuously adheres to and accumulates in the first portion ITP1, the process may not be normally performed. Accordingly, when pressing is performed a predetermined number of times or more, the first portion ITP1 should be removed from the suction stage A-STG. In an embodiment, after pressing is performed k times, the first portion ITP1 to which the contamination material CTM adheres may be removed from the suction stage A-STG, for example. Here, k may be a natural number more than 2. In addition, k may be larger than n. In an embodiment, k may be 30, for example.

Referring to FIG. 15, after pressing is performed k times, the first portion ITP1 may be removed from the suction stage A-STG. Specifically, to separate the interleaving paper ITP from the suction stage A-STG, the first portion ITP1 may be spaced apart from the suction stage A-STG in the third direction DR3.

The first roller ROL1 and the second roller ROL2 may rotate counterclockwise, so that the first portion ITP1 may move to the outside of the suction stage A-STG. A portion of the interleaving paper ITP rolled around the first roller ROL1 may be unrolled, and the first portion ITP1 may move toward the second roller ROL2 and may be rolled around the second roller ROL2.

Referring to FIG. 16, a portion of the interleaving paper ITP rolled around the first roller ROL1 may be unrolled, and a new portion of the interleaving paper ITP may be disposed under the suction stage A-STG. The second portion ITP2 of the interleaving paper ITP may move to the lower surface of the suction stage A-STG, and may be disposed on the lower surface of the suction stage A-STG. After the second portion ITP2 is suctioned to the lower surface of the suction stage A-STG, pressing described above may be performed again.

Such an operation may be repeated. In other word, after pressing is performed k times again, the second portion ITP2 may be removed. Then, the first roller ROL1 and the second roller ROL2 may rotate, so that a new portion of the interleaving paper ITP may be disposed under the suction stage A-STG.

In an embodiment, the suction stage A-STG may not be used, and a plurality of cover substrates including glass may be used. In addition, the interleaving paper ITP rolled around the first roller ROL1 and the second roller ROL2 may not be used, and a plurality of pieces of split interleaving paper may be used. In this case, a cover substrate and a piece of interleaving paper may be bonded to each other by an adhesive, and pressing may be performed by causing the pressing roller PRL to press the cover substrate. The cover substrate and the interleaving paper attached to each other may be replaced, after pressing is performed a predetermined number of times.

In addition, cassettes may be used for stacking a plurality of cover substrates and a plurality of interleaving papers. In this case, a transfer robot may be used to transfer the cover substrates and the interleaving papers from the cassettes.

However, in an embodiment of the invention, the suction stage A-STG is used to attach the interleaving paper ITP to the suction stage A-STG, so that it is unnecessary to bond the cover substrate and the interleaving paper. In addition, since cassettes for loading the cover substrates and the interleaving papers are not desired, transferring of the cover substrates and the interleaving papers from cassettes is not desired.

As a result, in an embodiment of the invention, since the suction stage A-STG and the rolled interleaving paper ITP are used for pressing, a manufacturing process for a window WIN may be simplified.

In an embodiment of the invention, since cassettes for loading cover substrates and interleaving papers for pressing are not used, but a suction stage and a rolled interleaving paper are used for pressing, a window manufacturing process may be simplified.

Although described with reference to the above embodiments, those skilled in the art will understand that various modifications and changes may be made to the invention without departing from the spirit and scope of the invention described in the following claims. In addition, the embodiments disclosed in the disclosure are not intended to limit the technical idea of the invention, and all technical ideas within the scope of the following claims and equivalents should be interpreted as being included in the scope of the invention.

What is claimed is:

1. A window manufacturing method comprising:
   providing a first adhesive on a dummy substrate;
   providing a first mother substrate on the first adhesive;

disposing a first portion of an interleaving paper on a surface of a suction stage disposed on the first mother substrate, the surface of the suction stage facing the first mother substrate; and pressing the suction stage toward the first mother substrate to attach the first mother substrate to the dummy substrate, wherein a plurality of vacuum suction holes is defined in the surface of the suction stage.

2. The window manufacturing method of claim 1, wherein the first portion is suctioned to the suction stage by suctioning force generated in the plurality of vacuum suction holes.

3. The window manufacturing method of claim 1, further comprising:

providing an n-th adhesive on an (n−1)-th mother substrate;

providing an n-th mother substrate on the n-th adhesive; and pressing the suction stage toward the n-th mother substrate to attach the n-th mother substrate to the (n−1)-th mother substrate, wherein n is a natural number of 2 or more.

4. The window manufacturing method of claim 3, further comprising:

cutting, into a plurality of unit substrates, a mother substrate including the first to n-th mother substrates stacked and attached to each other, in a plan view; and separating first to n-th windows from each other, which are stacked and attached to each other and included in the plurality of unit substrates.

5. The window manufacturing method of claim 3, wherein at least one of the dummy substrate, the first mother substrate, the (n−1)-th mother substrate, and the n-th mother substrate include glass.

6. The window manufacturing method of claim 3, further comprising:

removing the first portion from the suction stage after performing the pressing k times; and disposing a second portion of the interleaving paper on the surface of the suction stage, wherein k is a natural number of 2 or more.

7. The window manufacturing method of claim 6, wherein the removing the first portion from the suction stage comprises moving the first portion to an outside of the suction stage by rotating a plurality of rollers to which opposite ends of the interleaving paper are connected, and around which the interleaving paper is rolled, and the plurality of rollers comprises:

a first roller spaced apart from a first side of the suction stage in one direction parallel to a plane of the suction stage, and connected to a first end of the opposite ends of the interleaving paper; and a second roller spaced apart from a second side of the suction stage in the one direction, and connected to a second end of the opposite ends of the interleaving paper.

8. The window manufacturing method of claim 7, wherein the disposing the second portion on the surface of the suction stage comprises moving the second portion to the surface of the suction stage by rotating the plurality of rollers.

9. The window manufacturing method of claim 6, wherein k is greater than n.

10. The window manufacturing method of claim 1, wherein the pressing the suction stage toward the first mother substrate comprises pressing the suction stage toward the first mother substrate by moving a pressing roller disposed on an opposite surface of the suction stage in one direction, the opposite surface of the suction stage being opposite to the surface of the suction stage.

11. The window manufacturing method of claim 1, wherein the interleaving paper includes paper.

12. The window manufacturing method of claim 1, wherein the suction stage includes anodized aluminum.

\* \* \* \* \*